United States Patent [19]
Kamon

[11] Patent Number: 5,287,142
[45] Date of Patent: Feb. 15, 1994

[54] PROJECTION EXPOSURE APPARATUS

[75] Inventor: Kazuya Kamon, Itami, Japan

[73] Assignee: Mitsubishi Denki Kabushiki Kaisha, Tokyo, Japan

[21] Appl. No.: 972,293

[22] Filed: Nov. 5, 1992

[30] Foreign Application Priority Data

Dec. 10, 1991 [JP] Japan .................................. 3-326158

[51] Int. Cl.$^5$ ............................................. G03B 27/42
[52] U.S. Cl. .................................. 355/53; 355/71
[58] Field of Search ............................ 355/53, 67, 71

[56] References Cited

U.S. PATENT DOCUMENTS 5,144,362  9/1992  Kamon et al. .................. 355/53

Primary Examiner—Michael L. Gellner
Assistant Examiner—Khanh Dang
Attorney, Agent, or Firm—Leydig, Voit & Mayer

[57] ABSTRACT

A projection exposure apparatus for use in an LSI manufacturing process includes a light source for emitting incoherent light, a polyhedral prism for splitting the incoherent light from the light source into a plurality of rays of light, a condensing system for condensing the plurality of rays of light into overlapping rays illuminating a mask having a circuit pattern, and a projection lens system for condensing the light transmitted through the mask on the surface of a wafer.

5 Claims, 6 Drawing Sheets

LIGHT

PROJECTION EXPOSURE APPARATUS

BACKGROUND OF THE INVENTION

1. Field of the Invention

This invention relates to a projection exposure apparatus for use in an LSI manufacturing process.

2. Description of the Related Art

FIG. 5 shows the optical system of a conventional projection exposure apparatus. A fly-eye lens device 3 is arranged in front of a lamp house 1 through the intermediation of a mirror 2. An aperture member 4 is positioned in front of the fly-eye lens device 3. Further, a mask for exposure 8 including a desired circuit pattern is arranged in front of the aperture member 4 through the intermediation of condensing lenses 5 and 6 and a mirror 7. A wafer 10 is positioned in front of the mask 8 through the intermediation of a projection lens system 9. As shown in FIG. 6, the fly-eye lens device 3 has a fly-eye lens 12 fastened to a frame 13. The fly-eye lens 12 consists of a plurality of component lenses 11 of the same size arranged in a rectangular two-dimensional array. The position of an opening 4a of the aperture member 4 facing the fly-eye lens device 3 is indicated by a dashed line P. In FIG. 5, the frame 13 is omitted, and the fly-eye lens 12 is depicted as having a smaller number of component lenses 11 than in FIG. 6, for the sake of simplification.

Light emitted from the lamp house 1 is directed to the fly-eye lens device 3 by way of the mirror 2. The light transmitted through the component lenses 11 of the fly-eye lens device 3 illuminates the entire surface of the exposure area of the mask 8 through the opening 4a of the aperture member 4, the condensing lens 5, the mirror 7 and the condensing lens 6. FIG. 5 shows how the light from the component lens 11 at the center of the fly-eye lens device 3 illuminates the mask 8. However, the light from the other component lenses 11 likewise illuminates the entire surface of the exposure area of the mask 8. Thus, the rays of light from different component lenses 11 of the fly-eye lens overlap each other on the mask 8, thereby effecting uniform illumination of the mask 8. The light transmitted through the mask 8 reaches the wafer 10 by way of the projection lens system 9, thereby transferring the circuit pattern of the mask to the surface of the wafer 10.

A problem with this conventional projection exposure apparatus is that each component lens 11 of the fly-eye lens device 3 causes the light transmitted therethrough to diverge, so that, as shown in FIG. 7, part of the light from those component lenses 11 situated in the peripheral section of the fly-eye lens device 3 is dissipated sideways and does not reach the condensing lens 5, resulting in considerable power loss in the illuminating light from the lamp house 1.

SUMMARY OF THE INVENTION

This invention has been made with a view toward eliminating the above problem. It is an object of this invention to provide a projection exposure apparatus which is capable of reducing power loss in the illuminating light as well as effecting a uniform illumination.

A projection exposure apparatus according to this invention comprises: a light source for emitting incoherent light; a polyhedral prism for splitting the incoherent light into a plurality of rays of light; a condensing lens system for condensing the plurality of rays of light into overlapping rays illuminating a mask having a circuit pattern and a projection lens system for condensing light transmitted through the mask on the surface of a wafer.

DESCRIPTION OF THE PREFERRED EMBODIMENTS

An embodiment of this invention will now be described with reference to the accompanying drawings.

Figure 1:
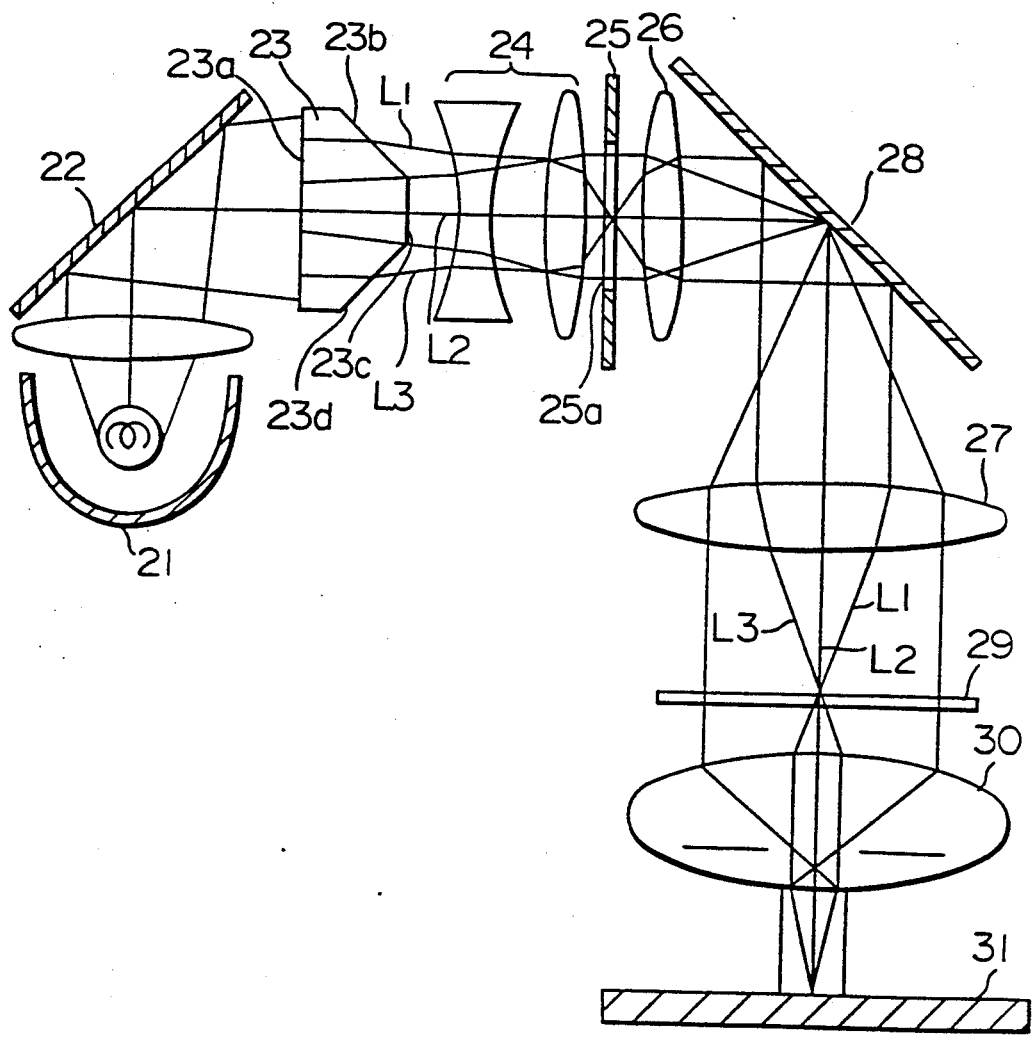
FIG. 1 shows the optical system of a projection exposure apparatus according to an embodiment of this invention.

Referring to FIG. 1, a polyhedral prism 23 is arranged in front of a lamp house 21 containing a lamp producing incoherent such as a mercury lamp. A mirror 22 reflects the light from the lamp to the prism 23. An aperture member 25 is positioned in front of the polyhedral prism 23 with an intervening relay-lens system 24. Further, a mask for exposure 29 having a desired circuit pattern is arranged in front of the aperture member 25 following, on an optical path, condensing lenses 26 and 27 and a mirror 28. A wafer 31 is positioned in front of the mask 29 with a projection lens system 30 intervening. The lamp house 21 and the mirror 22 are a source of light, and the condensing lenses 26 and 27 and a mirror 28 are a condensing-lens system.

Next, the operation of this embodiment will be described. First, incoherent light emitted from the lamp house 21 is reflected by the mirror 22 and then impinges upon the largest, principal plane 23a of the polyhedral prism 23. When outgoing from planes 23b, 23c and 23d of the prism 23, the light transmitted through the prism 23 is divided into a plurality of rays of light L1, L2 and L3 respectively corresponding to the planes 23b, 23c and 23d. Each of the rays of light L1, L2 and L3 illuminates the entire surface of the exposure area of the mask 29 through the relay-lens system 24, the opening 25a of the aperture member 25, the condensing lens 26, the mirror 28 and the condensing lens 27. As a result, the rays of light from the planes 23b, 23c and 23d of the polyhedral prism 23 overlap each other on the surface of the mask 29, thereby effecting a uniform illumination. The light transmitted through the mask 29 reaches the wafer 31 by way of the projection lens system, thereby transferring the circuit pattern of the mask to the surface of the wafer 31.

Figure 2:
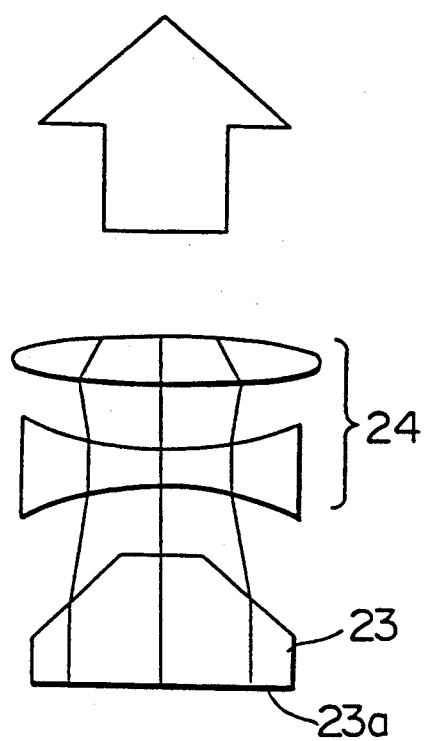
FIG. 2 shows the action of the polyhedral prism used in the embodiment.
Figure 2:
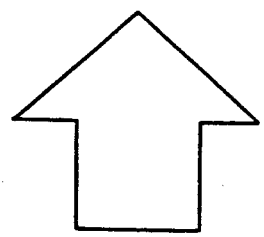

This embodiment uses the polyhedral prism 23 instead of the fly-eye lens device, which has conventionally been used. The polyhedral prism 23 divides the incoherent light from the lamp house 21 into a plurality of rays of light L1, L2 and L3, so that, as shown in FIG. 2, the light incident upon the largest, principal plane 23a of the prism 23 is transmitted from the planes 23b, 23c and 23d of the prism 23 without being dissipated sideways, and reaches the condensing lens 26 by way of the relay-lens system 24. Thus, the power loss of the illuminating light from the lamp house 21 can be reduced.

Figure 3:
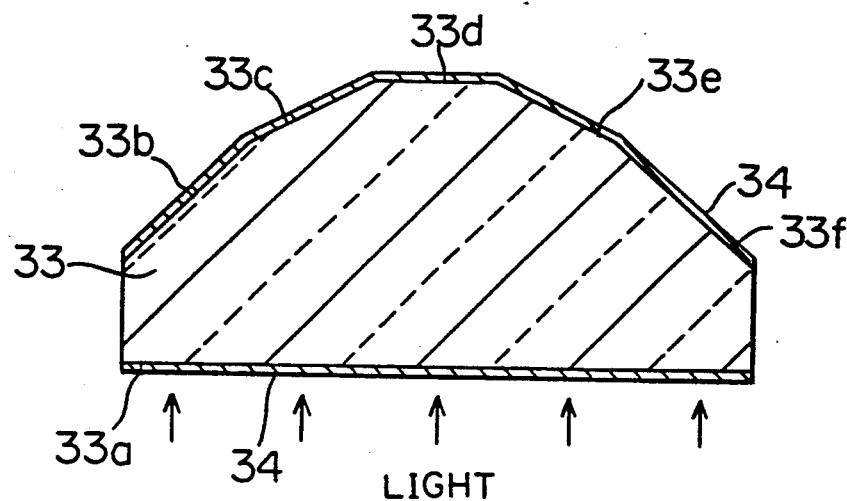
FIG. 3 is a sectional view of a polyhedral prism used in another embodiment.

By using a polyhedral prism 33 shown in FIG. 3 having a large number of planes 33b through 33f, the illuminating light from the lamp house 21 is divided into a large number of rays respectively corresponding to the planes 33b through 33f. As a result, the uniformity of the illumination is improved. In practice, it is desirable to use a polyhedral prism having between fifty and sixty planes. Further, by forming a reflection preventing film 34 on each of the planes 33a through 33f of the prism 33, through which light is transmitted, the power loss due to surface reflection is reduced, thereby providing an apparatus having a still higher throughput.

Figure 4:
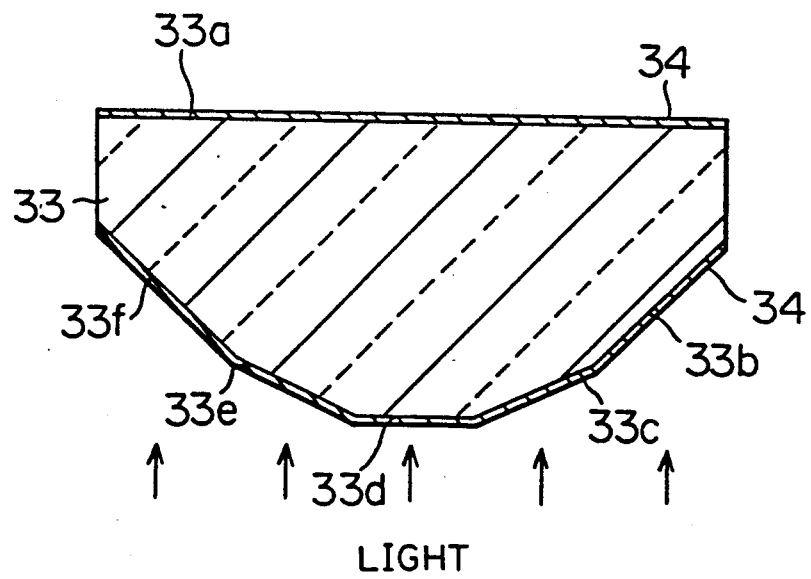
FIG. 4 is a sectional view of a polyhedral prism used in still another embodiment.
Figure 5:
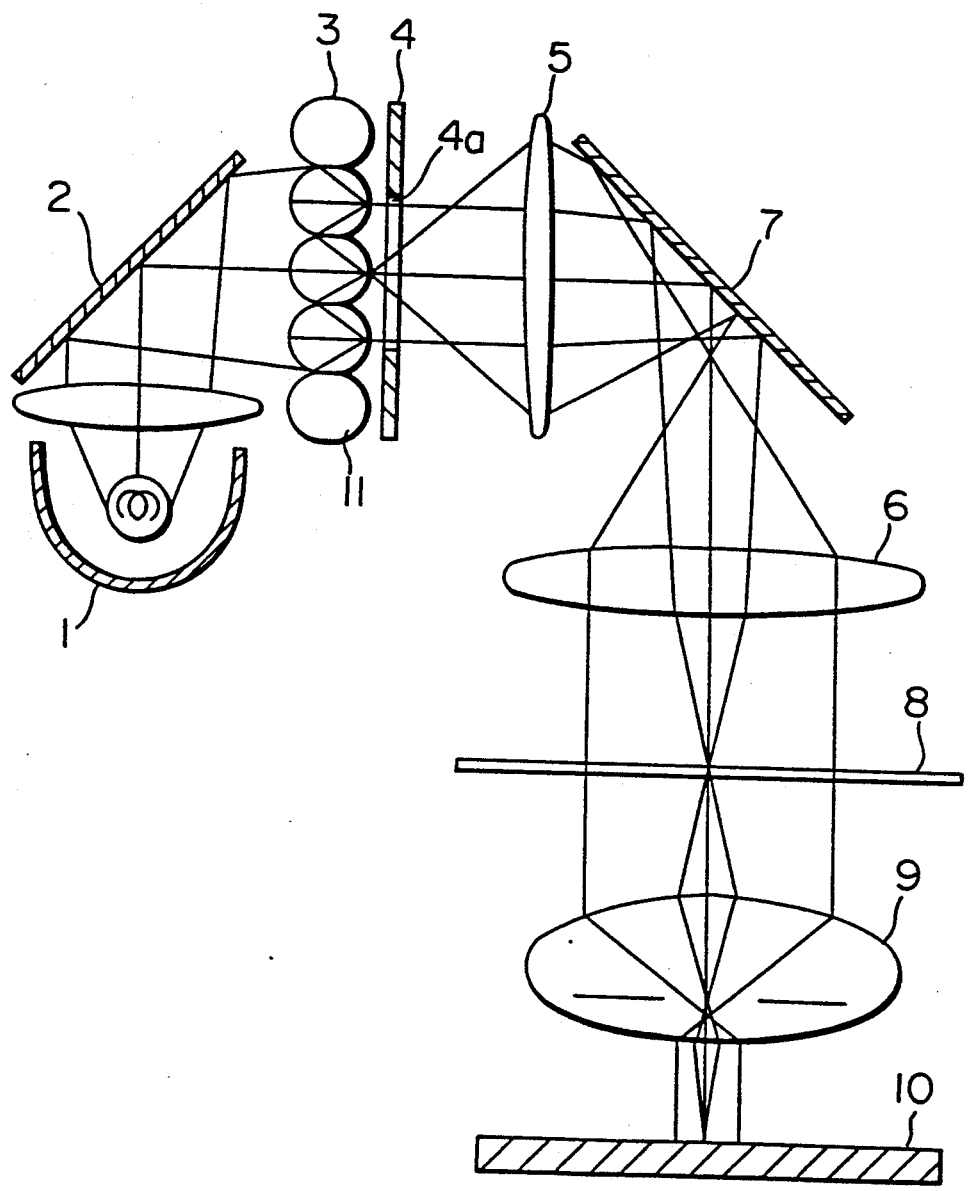
FIG. 5 shows the optical system of a conventional projection exposure apparatus.
Figure 6:
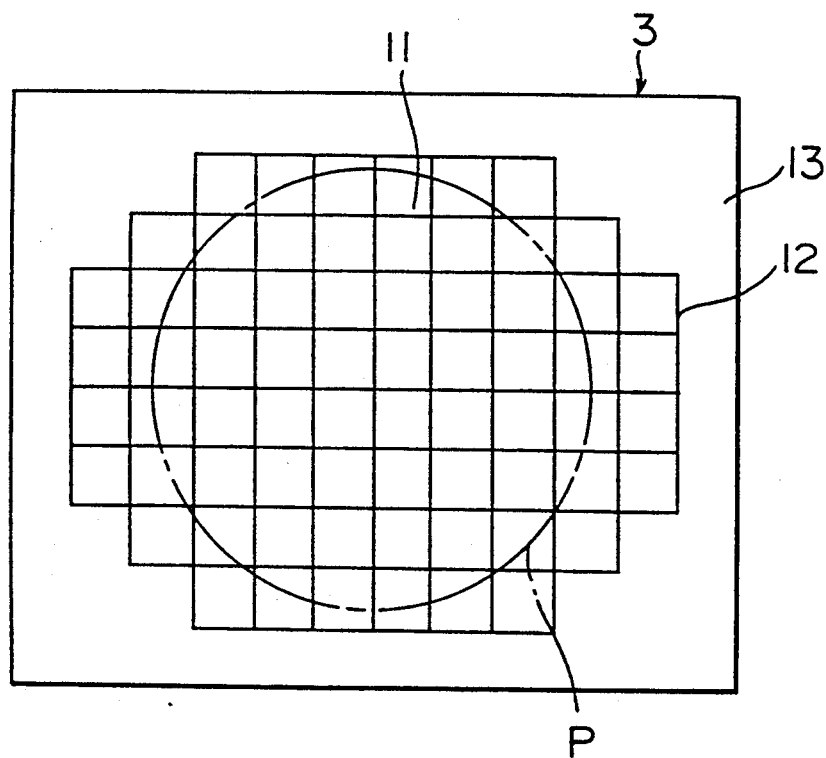
FIG. 6 is a plan view of the fly-eye lens device used in the apparatus of FIG. 5.
Figure 7:
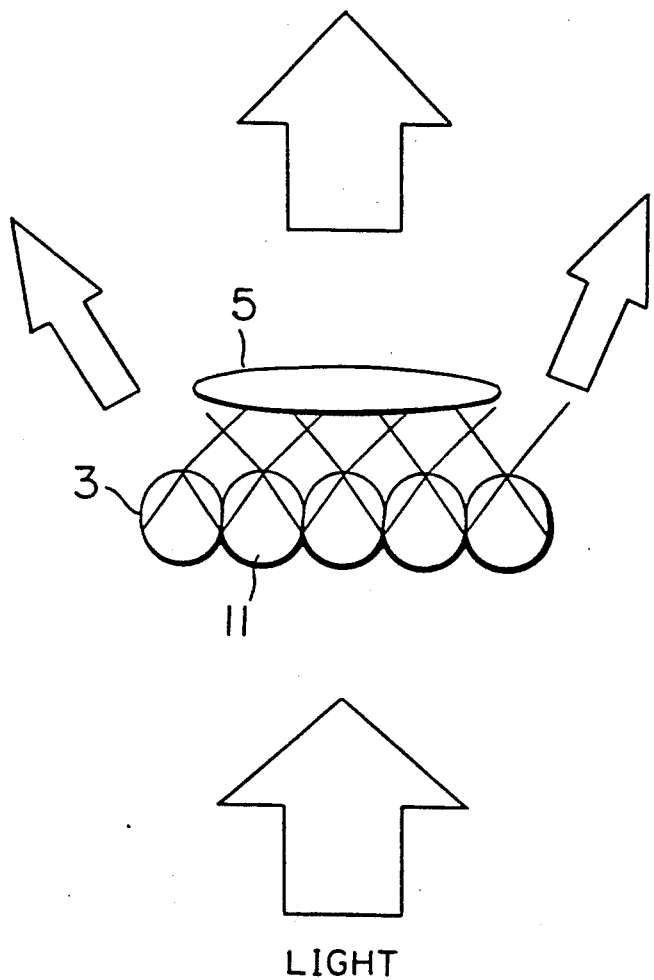
FIG. 7 illustrates the action of the fly-eye lens of FIG. 6.

It is not necessarily the largest, principal plane that the light is caused to strike. For example, as shown in FIG. 4, it is also possible to turn the polyhedral prism the other way and cause the light from the lamp house 21 to impinge upon the planes 33b through 33f and to be transmitted from the largest, principal plane 33a. Also in that case, it is possible to obtain the same effect as when the light impinges upon the largest, principal plane 33a.

What is claimed is:

1. A projection exposure apparatus comprising:
   an incoherent light source for emitting incoherent light;
   a polyhedral prism for splitting the incoherent light from said light source into a plurality of rays of light;
   a condensing lens system for condensing the plurality of rays of light into overlapping rays to illuminate a mask having a circuit pattern; and
   a projection lens system for condensing the light transmitted through said mask on the surface of a wafer.

2. A projection exposure apparatus as claimed in claim 1 wherein said polyhedral prism comprises a prism body having a surface and reflection preventing films on the surface of said prism body.

3. A projection exposure apparatus as claimed in claim 1 wherein said polyhedral prism includes a largest, principal plane directed toward said incoherent light source.

4. A projection exposure apparatus as claimed in claim 1 wherein said polyhedral prism includes a largest, principal plane directed toward said condensing lens system.

5. A projection exposure apparatus as claimed in claim 1 wherein said polyhedral prism includes fifty to sixty planar surfaces.

* * * * *